United States Patent
Bertness et al.

(10) Patent No.: US 6,445,158 B1
(45) Date of Patent: Sep. 3, 2002

(54) VEHICLE ELECTRICAL SYSTEM TESTER WITH ENCODED OUTPUT

(75) Inventors: Kevin I. Bertness, Batavia; Michael E. Troy, Lockport, both of IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 09/575,629

(22) Filed: May 22, 2000

Related U.S. Application Data

(60) Continuation-in-part of application No. 09/293,020, filed on Apr. 16, 1999, now Pat. No. 6,351,102, which is a continuation-in-part of application No. 09/426,302, filed on Oct. 25, 1999, now Pat. No. 6,091,245, which is a division of application No. 08/681,730, filed on Jul. 29, 1996, now Pat. No. 6,051,976.

(51) Int. Cl.$^7$ .................................................. H02J 7/00
(52) U.S. Cl. ........................................ 320/104; 320/139
(58) Field of Search ................................. 320/104, 134, 320/132, 137, 139; 324/426, 427, 430, 433, 434

(56) References Cited

U.S. PATENT DOCUMENTS

| | | | |
|---|---|---|---|
| 2,514,745 A | 7/1950 | Dalzell | 171/95 |
| 3,356,936 A | 12/1967 | Smith | 324/29.5 |
| 3,562,634 A | 2/1971 | Latner | 31/4 |

(List continued on next page.)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 4-8636 | 1/1991 |
| JP | 03274479 | 12/1991 |
| JP | 03282276 | 12/1991 |
| JP | 04131779 | 5/1992 |
| JP | 04372536 | 12/1992 |
| JP | 5216550 | 8/1993 |
| JP | 7-128414 | 5/1995 |
| WO | WO 93/22666 | 11/1993 |
| WO | WO 94/05069 | 3/1994 |
| WO | WO 98/58270 | 12/1998 |
| WO | WO 99/23738 | 5/1999 |

OTHER PUBLICATIONS

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

(List continued on next page.)

*Primary Examiner*—Gregory Toatley
*Assistant Examiner*—Lawrence Luk
(74) *Attorney, Agent, or Firm*—Westman, Champlin & Kelly

(57) ABSTRACT

An automotive vehicle electrical system tester includes a starter motor or charging system voltage measurement circuit configured to measure a voltage of an electrical system of a vehicle. A microprocessor is configured to diagnose the electrical system as a function of the measured voltage and responsively output the diagnosed condition on a display. The microprocessor is further configured to encrypt the diagnosed condition and responsively output encrypted information related to the condition.

118 Claims, 9 Drawing Sheets

U.S. PATENT DOCUMENTS

| | | |
|---|---|---|
| 3,593,099 A | 7/1971 | Scholl .......................... 320/13 |
| 3,607,673 A | 9/1971 | Seyl ............................... 204/1 |
| 3,676,770 A | 7/1972 | Sharaf et al. ............... 324/29.5 |
| 3,729,989 A | 5/1973 | Little ............................ 73/133 |
| 3,753,094 A | 8/1973 | Furuishi et al. ............ 324/29.5 |
| 3,808,522 A | 4/1974 | Sharaf ........................ 324/29.5 |
| 3,811,089 A | 5/1974 | Strezelewicz ................ 324/170 |
| 3,873,911 A | 3/1975 | Champlin ................... 324/29.5 |
| 3,876,931 A | 4/1975 | Godshalk .................... 324/29.5 |
| 3,886,443 A | 5/1975 | Miyakawa et al. ......... 324/29.5 |
| 3,889,248 A | 6/1975 | Ritter .......................... 340/249 |
| 3,906,329 A | 9/1975 | Bader ........................... 320/44 |
| 3,909,708 A | 9/1975 | Champlin ................... 324/29.5 |
| 3,936,744 A | 2/1976 | Perlmutter .................. 324/158 |
| 3,946,299 A | 3/1976 | Christianson et al. ......... 320/43 |
| 3,947,757 A | 3/1976 | Grube et al. ................... 324/28 |
| 3,969,667 A | 7/1976 | McWilliams ................ 324/29.5 |
| 3,979,664 A | 9/1976 | Harris ........................... 324/17 |
| 3,984,762 A | 10/1976 | Dowgiallo, Jr. ............. 324/29.5 |
| 3,984,768 A | 10/1976 | Staples .......................... 324/62 |
| 3,989,544 A | 11/1976 | Santo ............................ 429/65 |
| 4,008,619 A | 2/1977 | Alcaide et al. ................ 73/398 |
| 4,024,953 A | 5/1977 | Nailor, III ................... 206/344 |
| 4,053,824 A | 10/1977 | Dupuis et al. .............. 324/29.5 |
| 4,070,624 A | 1/1978 | Taylor ......................... 327/158 |
| 4,086,531 A | 4/1978 | Bernier ....................... 324/158 |
| 4,112,351 A | 9/1978 | Back et al. .................... 324/16 |
| 4,114,083 A | 9/1978 | Benham et al. ............... 320/39 |
| 4,126,874 A | 11/1978 | Suzuki et al. ................ 354/60 |
| 4,178,546 A | 12/1979 | Hulls et al. ................. 324/158 |
| 4,193,025 A | 3/1980 | Frailing et al. ............. 324/427 |
| 4,207,611 A | 6/1980 | Gordon ....................... 364/580 |
| 4,217,645 A | 8/1980 | Barry et al. ................. 364/483 |
| 4,315,204 A | 2/1982 | Sievers et al. ................ 322/28 |
| 4,316,185 A | 2/1982 | Watrous et al. ............. 340/636 |
| 4,322,685 A | 3/1982 | Frailing et al. ............. 324/429 |
| 4,363,407 A | 12/1982 | Barkler et al. ............... 209/3.3 |
| 4,369,407 A | 1/1983 | Korbell ....................... 324/416 |
| 4,379,989 A | 4/1983 | Kurz et al. ................... 320/26 |
| 4,379,990 A | 4/1983 | Sievers et al. ................ 322/99 |
| 4,390,828 A | 6/1983 | Converse et al. ............. 320/32 |
| 4,392,101 A | 7/1983 | Saar et al. .................... 320/20 |
| 4,396,880 A | 8/1983 | Windebank .................. 320/21 |
| 4,408,157 A | 10/1983 | Beaubien ...................... 324/62 |
| 4,412,169 A | 10/1983 | Dell'Orto ..................... 320/64 |
| 4,423,378 A | 12/1983 | Marino et al. .............. 324/427 |
| 4,423,379 A | 12/1983 | Jacobs et al. ............... 324/429 |
| 4,424,491 A | 1/1984 | Bobbett et al. .............. 324/433 |
| 4,459,548 A | 7/1984 | Lentz et al. ................. 324/158 |
| 4,514,694 A | 4/1985 | Finger ......................... 324/429 |
| 4,520,353 A | 5/1985 | McAuliffe ................... 340/636 |
| 4,633,418 A | 12/1986 | Bishop ........................ 364/554 |
| 4,659,977 A | 4/1987 | Kissel et al. .................. 320/64 |
| 4,663,580 A | 5/1987 | Wortman ...................... 320/35 |
| 4,667,143 A | 5/1987 | Cooper et al. ................ 320/22 |
| 4,667,279 A | 5/1987 | Maier ........................... 363/46 |
| 4,678,998 A | 7/1987 | Muramatsu .................. 324/427 |
| 4,679,000 A | 7/1987 | Clark .......................... 324/428 |
| 4,680,528 A | 7/1987 | Mikami et al. ............... 320/32 |
| 4,697,134 A | 9/1987 | Burkum et al. ............... 320/48 |
| 4,707,795 A | 11/1987 | Alber et al. ................. 364/550 |
| 4,709,202 A | 11/1987 | Koenck et al. ............... 320/43 |
| 4,710,861 A | 12/1987 | Kanner ......................... 363/46 |
| 4,719,428 A | 1/1988 | Liebermann ................ 324/436 |
| 4,743,855 A | 5/1988 | Randin et al. ............... 324/430 |
| 4,745,349 A | 5/1988 | Palanisamy et al. .......... 320/22 |
| 4,816,768 A | 3/1989 | Champlin ................... 324/428 |
| 4,820,966 A | 4/1989 | Fridman ....................... 320/32 |
| 4,825,170 A | 4/1989 | Champlin ................... 324/436 |
| 4,847,547 A | 7/1989 | Eng, Jr. ........................ 320/35 |
| 4,849,700 A | 7/1989 | Morioka et al. ............. 324/427 |
| 4,876,495 A | 10/1989 | Palanisamy et al. .......... 320/18 |
| 4,881,038 A | 11/1989 | Champlin ................... 324/426 |
| 4,912,416 A | 3/1990 | Champlin ................... 324/430 |
| 4,913,116 A | 4/1990 | Katogi et al. ................ 123/425 |
| 4,929,931 A | 5/1990 | McCuen ...................... 340/636 |
| 4,931,738 A | 6/1990 | MacIntyre et al. .......... 324/435 |
| 4,937,528 A | 6/1990 | Palanisamy ................. 324/430 |
| 4,947,124 A | 8/1990 | Hauser ........................ 324/430 |
| 4,956,597 A | 9/1990 | Heavvvvey et al. ........... 320/14 |
| 4,968,941 A | 11/1990 | Rogers ........................ 324/428 |
| 4,968,942 A | 11/1990 | Palanisamy ................. 324/430 |
| 5,004,979 A | 4/1991 | Marino et al. .............. 324/160 |
| 5,032,825 A | 7/1991 | Xuznicki .................... 340/636 |
| 5,047,722 A | 9/1991 | Wurst et al. ................ 324/430 |
| 5,087,881 A | 2/1992 | Peacock ...................... 324/378 |
| 5,126,675 A | 6/1992 | Yang ........................... 324/435 |
| 5,140,269 A | 8/1992 | Champlin ................... 324/433 |
| 5,144,218 A | 9/1992 | Bosscha ....................... 320/44 |
| 5,144,248 A | 9/1992 | Alexandres et al. ......... 324/428 |
| 5,160,881 A | 11/1992 | Schramm et al. ............... 322/7 |
| 5,170,124 A | 12/1992 | Blair et al. .................. 324/434 |
| 5,179,335 A | 1/1993 | Nor ............................... 320/21 |
| 5,204,611 A | 4/1993 | Nor et al. ..................... 320/21 |
| 5,214,370 A | 5/1993 | Harm et al. ................... 320/35 |
| 5,214,385 A | 5/1993 | Gabriel et al. .............. 324/434 |
| 5,241,275 A | 8/1993 | Fang ........................... 324/430 |
| 5,254,952 A | 10/1993 | Salley et al. ................ 324/429 |
| 5,266,880 A | 11/1993 | Newland ...................... 320/14 |
| 5,281,919 A | 1/1994 | Palanisamy ................. 324/427 |
| 5,281,920 A | 1/1994 | Wurst .......................... 324/430 |
| 5,295,078 A | 3/1994 | Stich et al. .................. 364/483 |
| 5,298,797 A | 3/1994 | Redl ........................... 307/246 |
| 5,300,874 A | 4/1994 | Shimamoto et al. .......... 320/15 |
| 5,302,902 A | 4/1994 | Groehl ........................ 324/434 |
| 5,315,287 A | 5/1994 | Sol .............................. 340/455 |
| 5,321,626 A | 6/1994 | Palladino .................... 364/483 |
| 5,331,268 A | 7/1994 | Patino et al. .................. 320/20 |
| 5,336,993 A | 8/1994 | Thomas et al. ........... 324/158.1 |
| 5,338,515 A | 8/1994 | Dalla Betta et al. .......... 422/95 |
| 5,339,018 A | 8/1994 | Brokaw ........................ 320/35 |
| 5,343,380 A | 8/1994 | Champlin ................... 363/46 |
| 5,347,163 A | 9/1994 | Yoshimura .................. 307/66 |
| 5,352,968 A | 10/1994 | Reni et al. .................... 320/35 |
| 5,365,160 A | 11/1994 | Leppo et al. .................. 320/22 |
| 5,365,453 A | 11/1994 | Startup et al. ............... 364/481 |
| 5,381,096 A | 1/1995 | Hirzel ......................... 324/427 |
| 5,412,323 A | 5/1995 | Kato et al. ................... 324/429 |
| 5,426,371 A | 6/1995 | Salley et al. ................ 324/429 |
| 5,426,416 A | 6/1995 | Jefferies et al. .............. 340/664 |
| 5,432,426 A | 7/1995 | Yoshida ........................ 320/20 |
| 5,434,495 A | 7/1995 | Toko ............................ 320/44 |
| 5,435,185 A | 7/1995 | Eagan ........................... 73/587 |
| 5,442,274 A | 8/1995 | Tamai .......................... 320/23 |
| 5,445,026 A | 8/1995 | Eagan ........................... 73/591 |
| 5,449,996 A | 9/1995 | Matsumoto et al. .......... 320/20 |
| 5,449,997 A | 9/1995 | Gilmore et al. ............... 320/39 |
| 5,451,881 A | 9/1995 | Finger ......................... 324/433 |
| 5,457,377 A | 10/1995 | Jonsson ......................... 320/5 |
| 5,469,043 A | 11/1995 | Cherng et al. ................ 320/31 |
| 5,485,090 A | 1/1996 | Stephens .................... 324/433 |
| 5,488,300 A | 1/1996 | Jamieson .................... 324/432 |
| 5,519,383 A | 5/1996 | De La Rosa ................ 340/636 |
| 5,528,148 A | 6/1996 | Rogers ........................ 324/426 |
| 5,537,967 A | 7/1996 | Tashiro et al. ............. 123/192.1 |
| 5,546,317 A | 8/1996 | Andrieu ...................... 364/481 |
| 5,548,273 A | 8/1996 | Nicol et al. ................. 340/439 |
| 5,550,485 A | 8/1996 | Falk ............................ 324/772 |
| 5,561,380 A | 10/1996 | Sway-Tin et al. ........... 324/509 |
| 5,562,501 A | 10/1996 | Kinoshita et al. ........... 439/852 |
| 5,572,136 A | 11/1996 | Champlin ................... 324/426 |

| | | | |
|---|---|---|---|
| 5,574,355 A | 11/1996 | McShane et al. | 320/39 |
| 5,583,416 A | 12/1996 | Klang | 320/22 |
| 5,585,728 A | 12/1996 | Champlin | 324/427 |
| 5,589,757 A | 12/1996 | Klang | 320/22 |
| 5,592,093 A | 1/1997 | Klingbiel | 324/426 |
| 5,596,260 A | 1/1997 | Moravec et al. | 320/30 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/48 |
| 5,621,298 A | 4/1997 | Harvey | 320/5 |
| 5,633,985 A | 5/1997 | Severson et al. | 395/2.76 |
| 5,642,031 A | 6/1997 | Brotto | 320/21 |
| 5,650,937 A | 7/1997 | Bounaga | 364/483 |
| 5,652,501 A | 7/1997 | McClure et al. | 320/17 |
| 5,656,920 A | 8/1997 | Cherng et al. | 320/31 |
| 5,675,234 A | 10/1997 | Greene | 320/15 |
| 5,677,077 A | 10/1997 | Faulk | 429/90 |
| 5,699,050 A | 12/1997 | Kanazawa | 340/636 |
| 5,701,089 A | 12/1997 | Perkins | 327/772 |
| 5,705,929 A | 1/1998 | Caravello et al. | 324/430 |
| 5,710,503 A | 1/1998 | Sideris et al. | 320/6 |
| 5,717,336 A | 2/1998 | Basell et al. | 324/430 |
| 5,717,937 A | 2/1998 | Fritz | 395/750.01 |
| 5,739,667 A | 4/1998 | Matsuda et al. | 320/5 |
| 5,747,909 A | 5/1998 | Syverson et al. | 310/156 |
| 5,757,192 A | 5/1998 | McShane et al. | 324/427 |
| 5,760,587 A | 6/1998 | Harvey | 324/434 |
| 5,773,978 A | 6/1998 | Becker | 324/430 |
| 5,789,899 A | 8/1998 | van Phuoc et al. | 320/30 |
| 5,793,359 A | 8/1998 | Ushikubo | 345/169 |
| 5,808,469 A | 9/1998 | Kopera | 324/43.4 |
| 5,821,756 A | 10/1998 | McShane et al. | 324/430 |
| 5,825,174 A | 10/1998 | Parker | 324/106 |
| 5,831,435 A | 11/1998 | Troy | 324/426 |
| 5,862,515 A | 1/1999 | Kobayashi et al. | 702/63 |
| 5,872,443 A | 2/1999 | Williamson | 320/21 |
| 5,895,440 A | 4/1999 | Procter et al. | 702/63 |
| 5,914,605 A | 6/1999 | Bertness | 324/426 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,969,625 A | 10/1999 | Russo | 340/636 |
| 6,002,238 A | 12/1999 | Champlin | 320/134 |
| 6,008,652 A | 12/1999 | Theofanopulos et al. | 324/434 |
| 6,009,369 A | 12/1999 | Boisvert et al. | 701/99 |
| 6,031,354 A | 2/2000 | Wiley et al. | 320/116 |
| 6,037,751 A | 3/2000 | Klang | 320/160 |
| 6,037,777 A | 3/2000 | Champlin | 324/430 |
| 6,051,976 A | 4/2000 | Bertness | 324/426 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/134 |
| 6,091,245 A | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,150,793 A | 11/2000 | Lesesky et al. | 320/104 |
| 6,163,156 A | 12/2000 | Bertness | 324/426 |
| 6,172,483 B1 | 1/2001 | Champlin | 320/134 |
| 6,172,505 B1 | 1/2001 | Bertness | 324/430 |
| 6,222,369 B1 | 4/2001 | Champlin | 324/430 |
| 6,225,808 B1 | 5/2001 | Varghese et al. | 324/426 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,254 B1 | 7/2001 | Klang | 324/427 |
| 6,262,563 B1 | 7/2001 | Champlin | 320/134 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,310,481 B2 | 10/2001 | Bertess | 324/430 |
| 6,313,607 B1 | 11/2001 | Champlin | 320/132 |
| 6,313,608 B1 | 11/2001 | Varghese et al. | 32/132 |
| 6,316,914 B1 | 11/2001 | Bertness | 320/134 |
| 6,323,650 B1 | 11/2001 | Bertness et al. | 324/426 |
| 6,329,793 B1 * | 12/2001 | Bertness et al. | 320/132 |
| 6,331,762 B1 | 12/2001 | Bertness | 320/134 |
| 6,332,113 B1 | 12/2001 | Bertness | 702/63 |
| 6,351,102 B1 * | 2/2002 | Troy | 320/139 |

OTHER PUBLICATIONS

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F. J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19. pp. 1–5.

"A Bridge for Measuring Storage Battery Resistance", by E. Willihncanz, *The Electrochemical Society*, preprint 79–20, Apr. 1941, pp. 253–258.

National Semiconductor Corporation, "High Q Notch Filter", 3/69, Linear Brief 5, Mar. 1969.

Burr–Brown Corporation, "Design A 60 Hz Notch Filter with the UAF42", Jan. 94, AB–071, 1994.

National Semiconductor Corporation, "LMF90–4$^{th}$ –Order Elliptic Notch Filter", 12/94, RRD–B30M115, Dec. 1994.

* cited by examiner

VEHICLE ELECTRICAL SYSTEM TESTER WITH ENCODED OUTPUT

This application is a C-I-P of U.S. patent application Ser. No. 09/293,020, filed Apr. 16, 1999, entitled "METHOD AND APPARATUS FOR AUDITING A BATTERY TEST" now U.S. Pat. No. 6,351,102 and a C-I-P of Ser. No. 09/426,302, filed Oct. 25, 1999, entitled "METHOD AND APPARATUS FOR AUDITING A BATTERY TEST" now U.S. Pat. No. 6,091,245, which is a Divisional of U.S. patent application Ser. No. 08/681,730, filed Jul. 29, 1996, entitled "AUTOMOTIVE BATTERY CHARGING SYSTEM TESTER" now U.S. Pat. No. 6,051,976.

BACKGROUND OF THE INVENTION

The present invention relates to devices for testing an automotive vehicle. More specifically, the present invention relates to a battery charging system tester for an automotive vehicle.

Automotive vehicles include a storage battery for operating electronics in the vehicle and using an electric starter to start the vehicle engine. A battery charging system is coupled to the engine and is powered by the engine when the vehicle is running. The charging system is used to charge the storage battery when the vehicle is operating.

Many attempts have been made to test the battery of the vehicle. One technique which has been pioneered by Dr. Keith S. Champlin and Midtronics, Inc. of Burr Ridge, Ill. relates to measuring the conductance of batteries to determine their condition. This technique is described in a number of United States patents, for example, U.S. Patent Nos. U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; and U.S. Pat. No. 6,051,976, issued Apr. 18, 2000, entitled METHOD AND APPARATUS FOR AUDITING A BATTERY TEST.

With the advent of accurate battery testing, it has become apparent that in some instances the battery in the vehicle may be good, and a problem related to the battery charging system is the cause of the perceived battery failure. A vehicle charging system generally includes the battery, an alternator, a regulator and an alternator drive belt. In most modern vehicles, the regulator is built into the alternator housing and is referred to as an internal regulator. The role of the charging system is two fold. First, the alternator provides charging current for the battery. This charging current ensures that the battery remains charged while the vehicle is being driven and therefore will have sufficient capacity to subsequently start the engine. Second, the alternator provides an output current for all of the vehicle electrical loads. In general, the alternator output, the battery capacity, the starter draw and the vehicle electrical load requirements are matched to each other for optimal performance. In a properly functioning charging system, the alternator will be capable of outputting enough current to drive the vehicle electrical loads while simultaneously charging the battery. Typically, alternators range in size from 60 to 120 amps.

A number of charging system testers have been used to evaluate the performance of the vehicle charging system. These testers generally use an inductive "amp clamp." The amp clamp is placed around a cable or wire and inductively couples to the cable or wire such that the current passing through the wire can be measured. This measurement can be made without having to disconnect the wire. In such a system, typically the operator determines the rated size of the alternator. Next, the operator connects the amp clamp to the output cable of the alternator and an electrical load such as a carbon pile load tester, is placed across the battery. This is a large resistive load capable of receiving several hundred amps which will force the alternator to provide its maximum output. The maximum output current can then be measured using the amp clamp connection. If the measured output is less than the rated output, the alternator is determined to be malfunctioning. Such a test is cumbersome as the equipment is large and difficult to handle. Further, it is difficult, particularly with compact engines, to reach the alternator output cable. Further, in some cases, the amp clamp may not fit around the output cable. It is also very easy to place the amp clamp around the wrong cable causing a false test.

Another testing technique is described in U.S. Pat. No. 4,207,611, which issued Jun. 10, 1980 and is entitled APPARATUS AND METHOD FOR CALIBRATED TESTING OF A VEHICLE ELECTRICAL SYSTEM. The device described in this reference monitors voltage changes present at the cigarette lighter of an automotive vehicle in order to determine the condition of the alternator by applying internal loads such as head lamps and blowers, while the engine is running.

SUMMARY OF THE INVENTION

An automotive vehicle electrical system tester includes a starter motor or charging system voltage measurement circuit configured to measure a voltage of an electrical system of a vehicle. A microprocessor is configured to diagnose the electrical system as a function of the measured voltage and responsively output the diagnosed condition on a display. The microprocessor is further configured to encrypt the diagnosed condition and responsively output an encrypted condition.

DETAILED DESCRIPTION OF THE PREFERRED EMBODIMENTS

Figure 1:
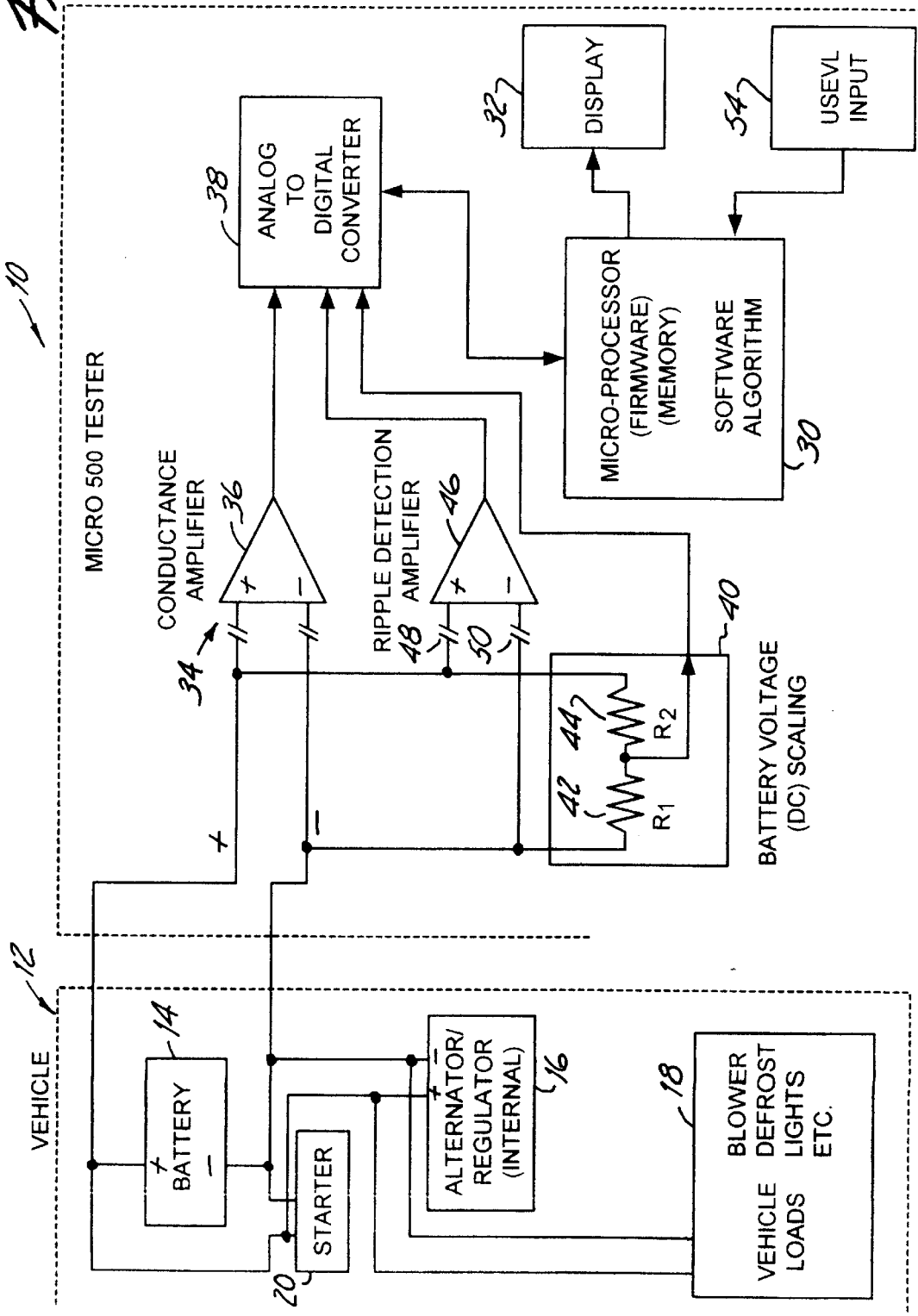
FIG. 1 is a simplified block diagram of an automotive battery charging system tester in accordance with the present invention.

FIG. 1 is a simplified block diagram of a battery charging system tester 10 in accordance with one embodiment of the present invention coupled to a vehicle 12. Vehicle 12 includes a battery 14 having positive and negative terminals, an alternator with internal regulator 16, various vehicle loads 18, and a starter motor 20. In operation, battery 14 provides power to starter 20 and vehicle loads 18 when the engine in vehicle 12 is not running. When the engine in vehicle 12 is running, alternator 16 is used to power vehicle loads 18 and provide a charging current to battery 14 to maintain the charge of battery 14.

Charging system tester 10 includes a microprocessor 30 which controls operation of tester 10 and provides instructions and test result information to an operator through, for example, a display 32. Tester 10 includes a battery testing section 34 which is illustrated generally as conductance amplifier 36. Section 34 operates in accordance with, for example, the conductance based battery testing techniques described in Champlin patents U.S. Patent Nos. U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,598,098, issued Jan. 28, 1997, entitled ELECTRONIC BATTERY TESTER WITH VERY HIGH NOISE IMMUNITY; U.S. Pat. No. 5,821,756, issued Oct. 13, 1998, entitled ELECTRONIC BATTERY TESTER WITH TAILORED COMPENSATION FOR LOW STATE-OF-CHARGE. Section 34 is illustrated in very simplified form and conductance amplifier 36 provides an output to an analog to digital converter 38 which is related to the internal conductance of battery 14.

A DC voltage sensor 40 includes voltage scaling resistors 42 and 44 and is coupled to battery 14 to provide an output to analog to digital converter 38 which is representative of the DC voltage across battery 14. Further, an AC ripple detector amplifier 46 is coupled to battery 14 through capacitors 48 and 50 and provides an output to analog to digital converter 38 which is representative of the AC ripple voltage across battery 14.

Microprocessor 30 controls analog to digital converter 38 to select which of the three inputs to digitize. Microprocessor 30 includes firmware, memory, and a software program in accordance with the invention. The user input 54 is coupled to microprocessor 30 to provide the information to microprocessor 30 from an operator.

Preferably, tester 10 is portable such that it may be easily moved between vehicles or otherwise transported. Portability of tester 10 is achieved because tester 10 does not require large internal carbon pile loads to load the battery charging system. Instead, as described herein, tester 10 utilizes loads internal to the vehicle 12 in testing the charging system. Further, the battery tester performed by tester 10 is in accordance with the non-load battery testing technique as described above.

Figure 2:
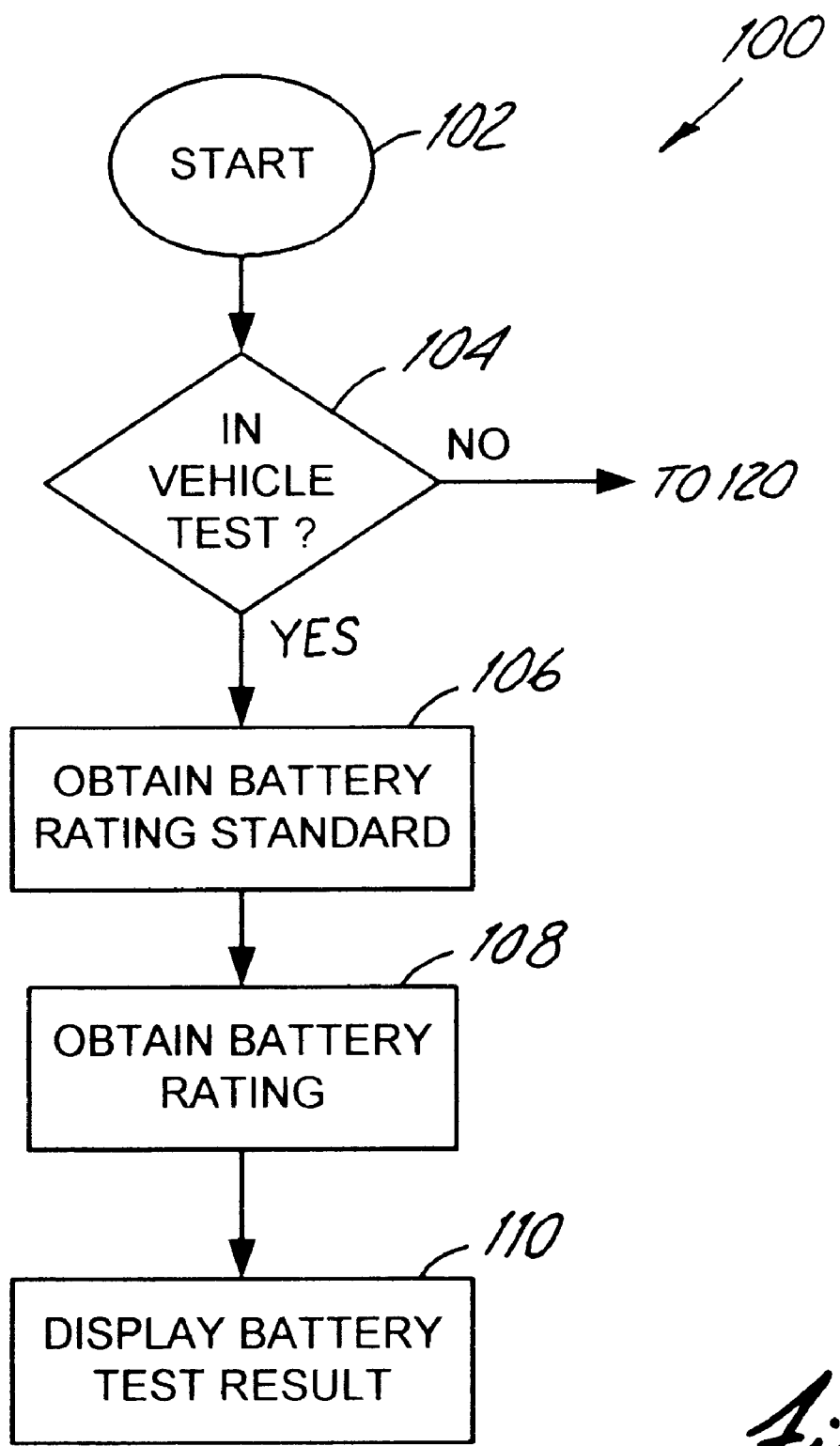
FIG. 2 is a simplified flow chart showing steps in a battery test.

FIGS. 2–8 are simplified block diagrams illustrating steps in accordance with the invention. User input for the steps can be through user input device 54 and a display can be provided through display device 32. In FIG. 2, block diagram 100 begins at start block 102. At block 104 the type of vehicle test is selected. If it is an in-vehicle test, control is passed to block 106. If it is an out of vehicle test, control is passed to block 120. At block 106, the user is prompted to input the battery rating standard to be used for the test. Various standards include SAE, DIN, IEC, EN, JIS or a battery stock number. At block 108, the user is prompted to input the battery rating according to the selected standard. A battery test is then performed at block 110, the results of the battery test are displayed including battery voltage, battery cold cranking amps, and a general condition of the battery such as good, good but recharged, charged and retest, replace battery or bad cell-replace. Any type of battery test may be used, however, conductance, resistance, impedance or admittance based testing as described in the Champlin and Midtronics patents is preferred.

Figure 3:
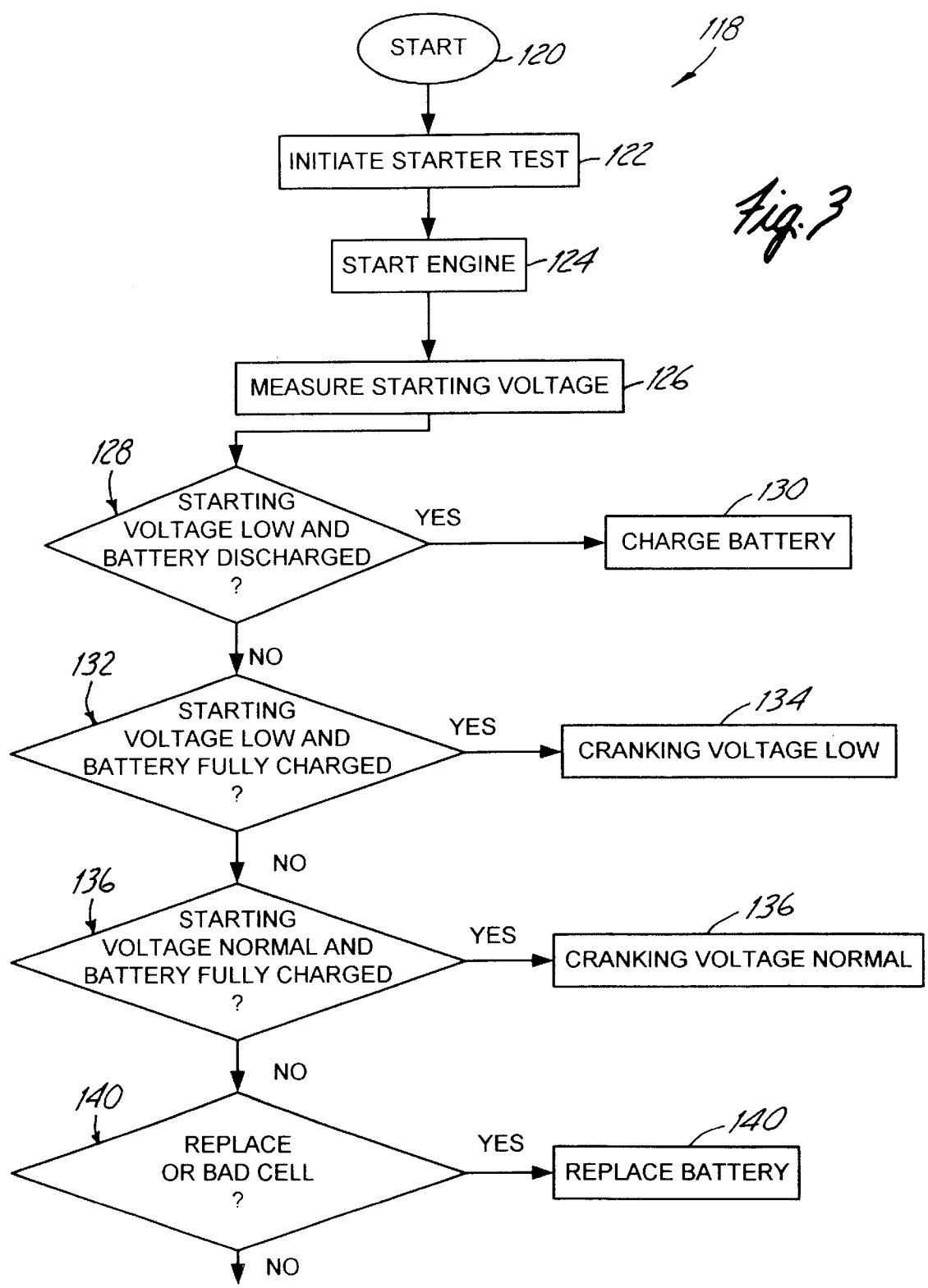
FIG. 3 is a simplified flow chart showing steps in a starter test.

FIG. 3 is a simplified block diagram 118 for an in-vehicle test. When the user initiates a starter test, for example through an input through user input 54, control is passed to block 124 and the operator is instructed to start the engine. Microprocessor 30 detects that the engine is being started by monitoring the resultant in drop in voltage across battery 14. The starting voltage is measured at block 126. Once the engine starts, and the voltage begins to rise, the tester 10 will display one of four different test results. At block 128, if the starting voltage is low and the battery is discharged, the message "charge battery" is displayed at block 130. At block 132, if the starting voltage is low and the battery has a full charge, the message "cranking voltage low" is displayed at block 134 along with the measured voltage. If at block 136, the starting voltage is normal and the battery has a full charge, block 138 displays cranking voltage normal along with the measured voltage. If, at block 140, the battery test result was either replaced or bad cell, block 142 displays the message replace battery. The low and normal cranking voltages can be selected as desired and using known techniques.

Figure 4:
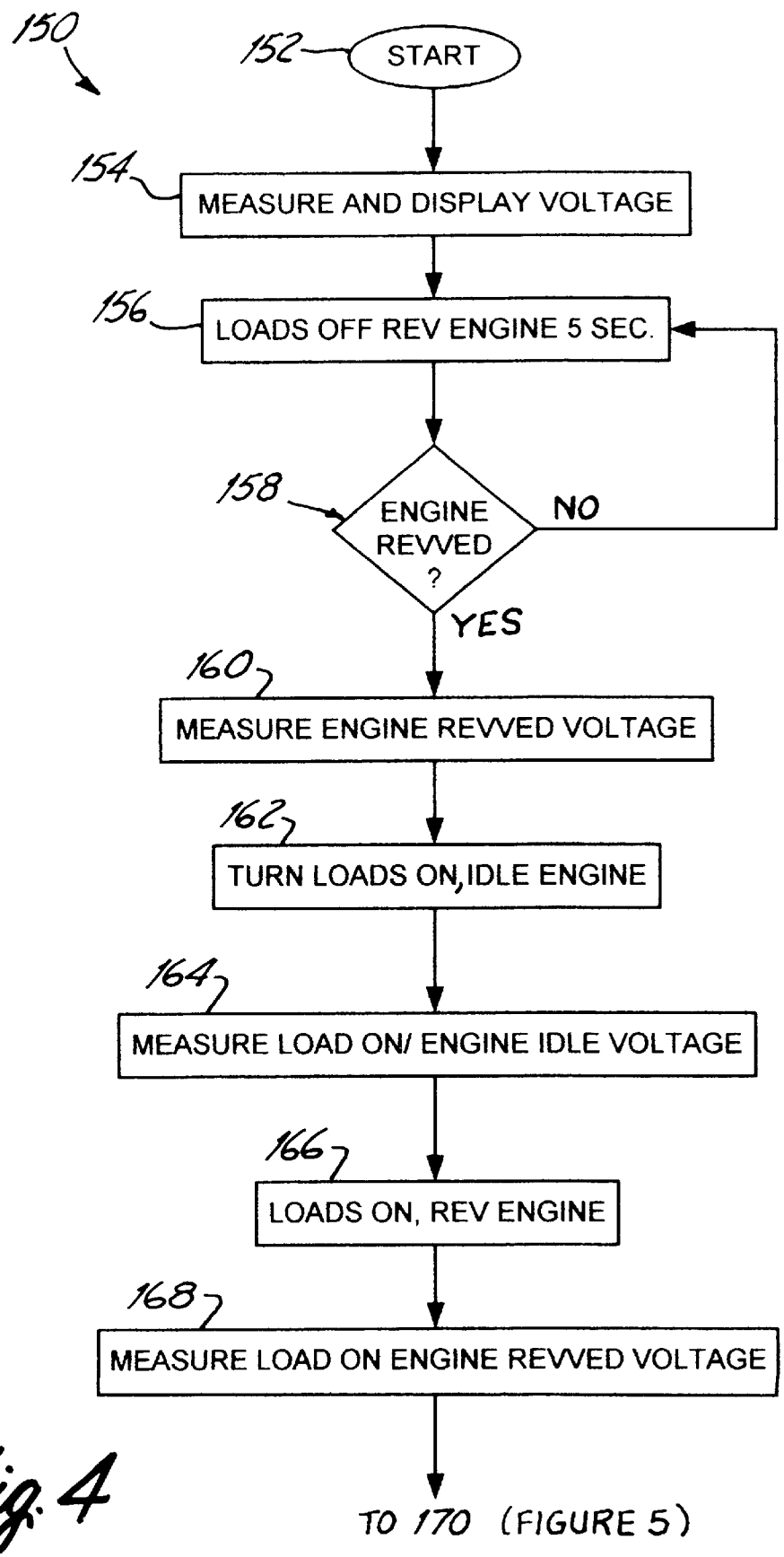
FIG. 4 is a simplified flow chart showing steps in a charging system test.
Figure 5:
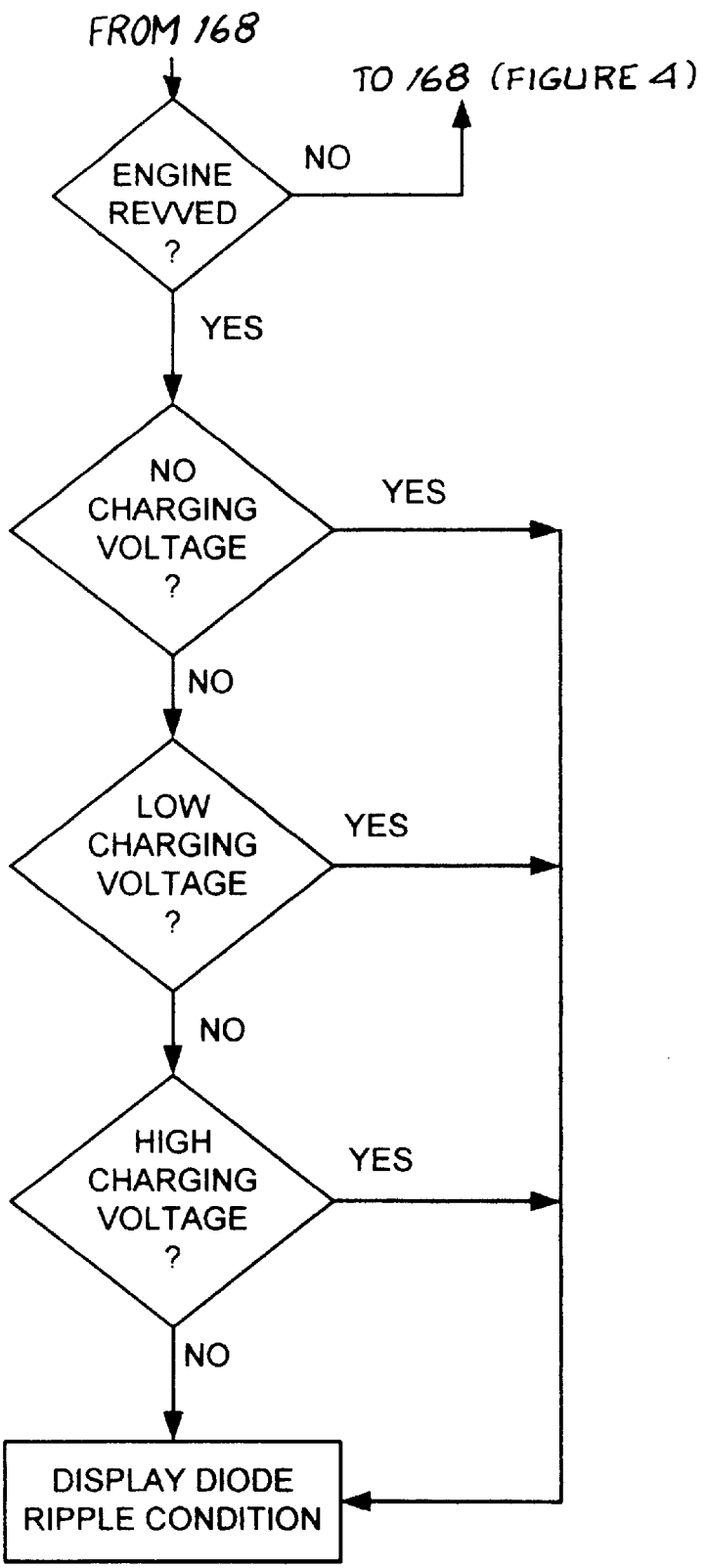
FIG. 5 is a simplified flow chart showing further steps in the charging system test of FIG. 4.

FIG. 4 is a block diagram 150 which illustrates steps in a charging system test in accordance with another aspect of the invention. At block 152, the procedure is initiated by the operator while the engine in vehicle 12 is running. At block 154, the voltage across battery 14 due to alternator 16 is measured and displayed. The operator may press and enter button on user input 54 to continue operation and at block 156 the operator is instructed to turn off all vehicle loads and rev the engine for 5 seconds. At block 158, the revving of the engine is detected by monitoring the AC ripple across battery 14 using ripple detection amplifier 46. If, after 30 seconds, microprocessor 30 does not detect engine revving, control is returned to block 156 and the procedure is repeated. At block 160, the engine revved voltage is measured and control is passed to block 162 where the operator is instructed to turn loads within the vehicle (i.e., headlights, fans, etc.) on and idle the engine. Again, an enter key on user input 54 is pressed and control is passed to block 164 and tester 10 measures the load on, engine idle voltage. At 166, the user is instructed to rev the engine with the loads on and another voltage is obtained at block 168. Control is then passed to block 170 in FIG. 5 and it is determined whether the engine speed has increased. At block 172, if there is no charging voltage, that is i.e., the charging voltage is less than or the same as the idle voltage, an output is displayed. Similarly, if the charging voltage is low such that the total voltage across the battery is less than, for example, 13 volts, an output is displayed. At block 176, if a high charging voltage is detected, such as more than 2.5 volts above the idle voltage, an output is displayed. When control reaches block 178, an output is provided indicative of the diode ripple voltage. This voltage can be obtained during any of the measurements where the engine is revved. If the ripple voltage is greater than, for example, 130 mV, an indication is provided that there is a diode or a stator problem.

Figure 6:
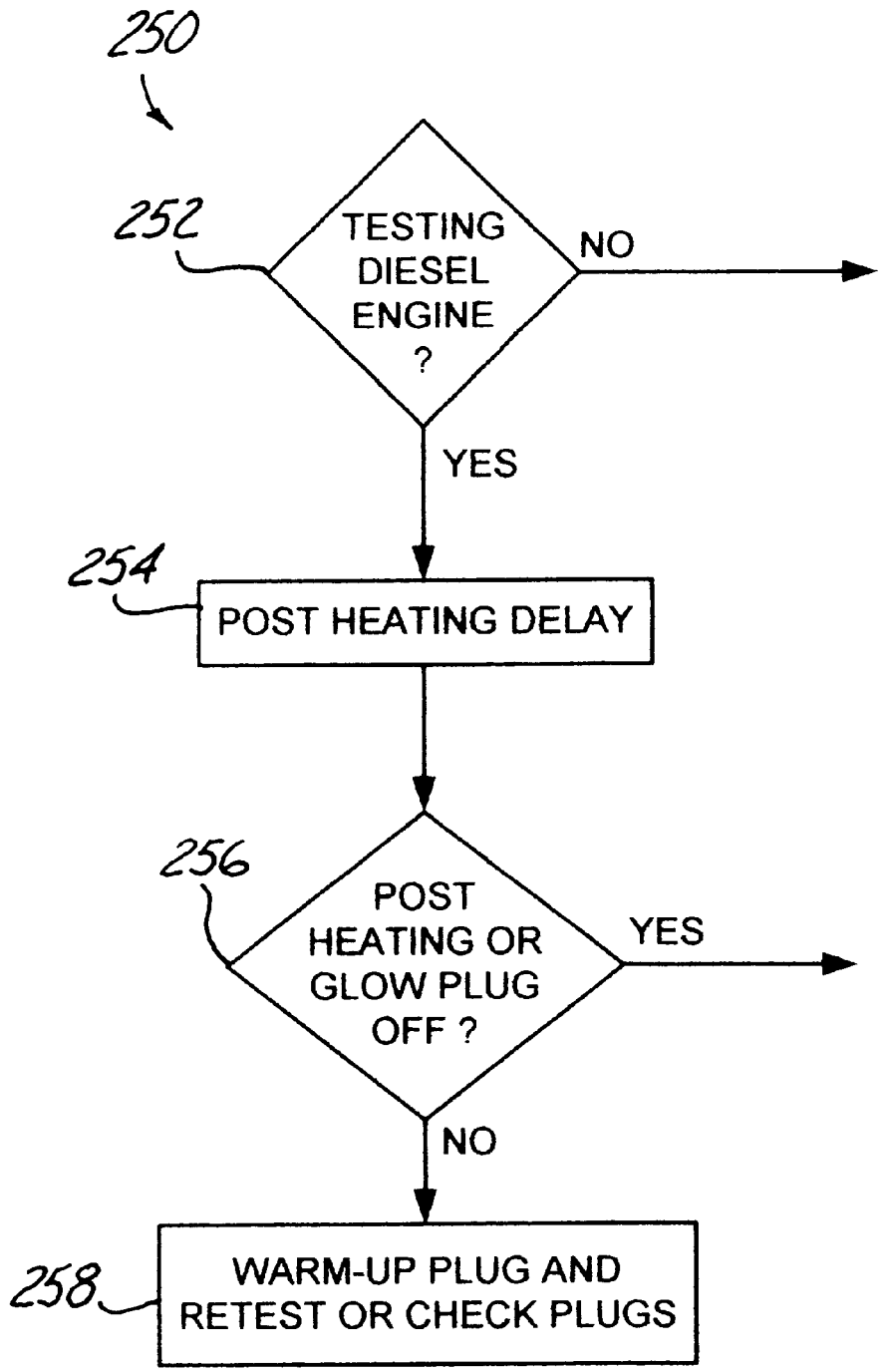
FIG. 6 is a simplified flow chart showing steps in a diesel engine charging system test.
Figure 7:
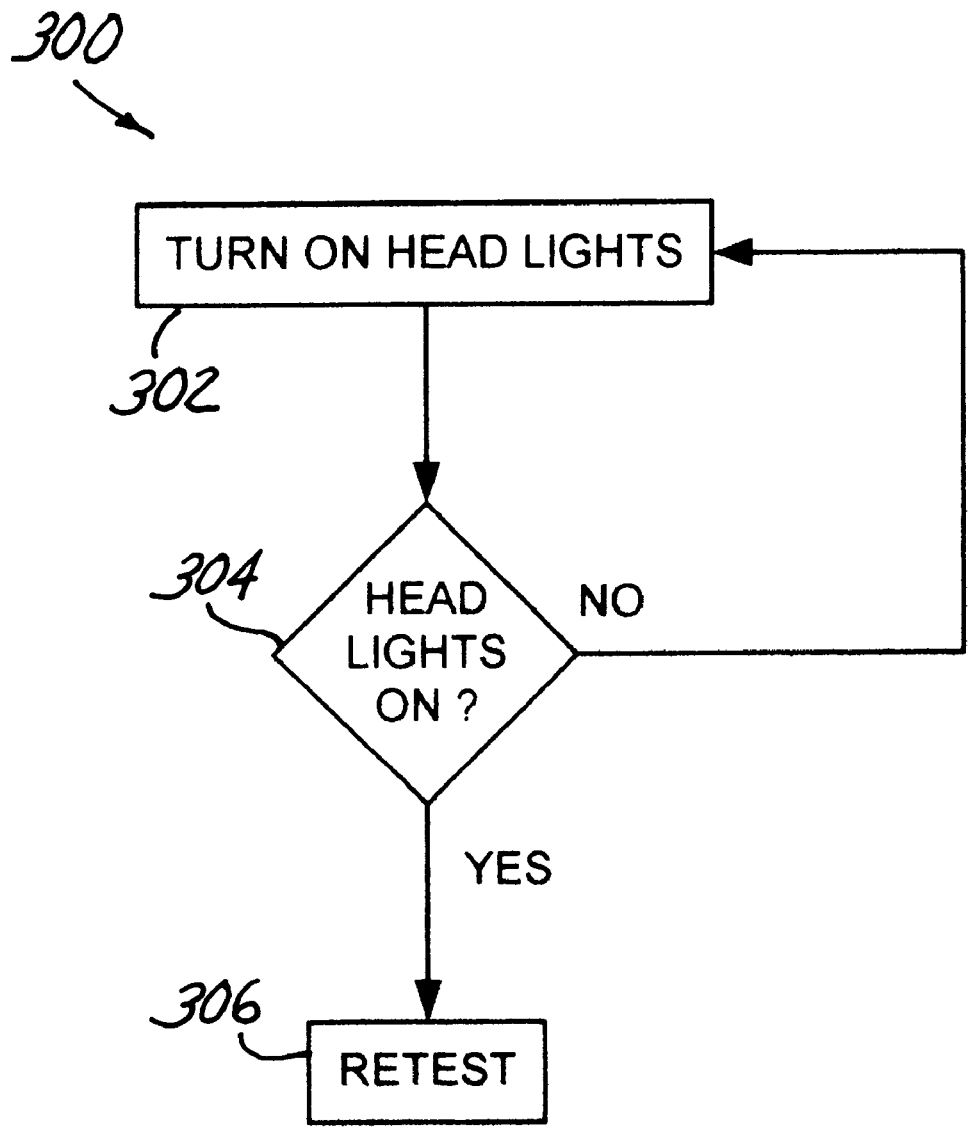
FIG. 7 is a simplified flow chart showing steps to remove surface charge.

FIG. 6 is a block diagram of a diesel test algorithm 250. If the tester 10 does not detect a charging or a ripple voltage, the tester begins the diesel test algorithm shown at 250. This allows the glow plugs of a diesel engine to turn off. If, at any time during the procedure, a charging voltage and a ripple are detected, the normal test procedure will resume. At block 252, the user is asked to input information as to whether the engine under test is a diesel engine. If the engine is not a diesel engine, a charging system problem is indicated. If the engine is diesel, control is passed to block 254 and a post heating delay, such as 40 seconds, passes at block 256, if there is a post heating or glow plugs off condition, then a charging system problem is indicated. If there is a post heating or glow plug on condition, the operator is instructed to warm up the plugs and retest, or check the glow plugs.

Additionally, the tester 10 can receive a temperature input from the operator and adjust the battery test appropriately.

If the battery test indicates that the battery may have been charged before testing, the user is prompted to indicate whether the test is being performed before charging the battery or after charging the battery and the system is retested.

Figure 8:
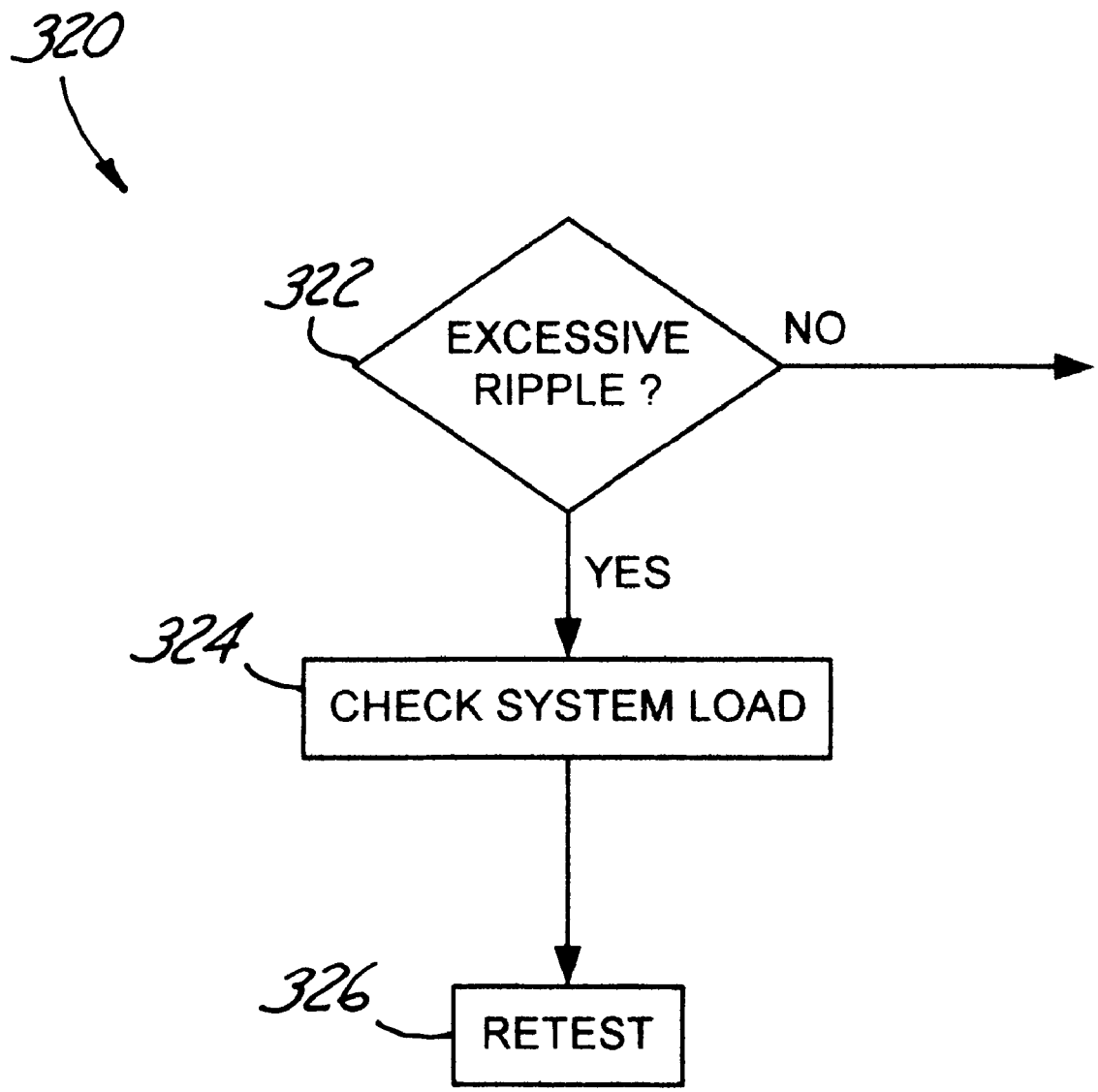
FIG. 8 is a simplified flow chart showing a ripple test.

If the tester 10 determines that the battery may have surface charge, the operator is instructed to turn on the vehicle head lights as indicated in flow chart 300 at block 302. If a drop in voltage is detected at block 304 indicating that the head lights have been turned on, control is passed to block 306. If, however, the head lights have not been turned on, control is returned to block 302. At block 306, the system is retested. Flow chart 320 of FIG. 8 shows a noise detection algorithm. If excessive ripple is detected during engine idle periods at block 322, the operator is instructed to check system loads at block 324. At block 326, the system is retested.

Based upon the test, an output can be printed or otherwise provided to an operator indicating the results of the battery test, the battery rating, the actual measured battery capacity, the voltage, the voltage during cranking and whether the cranking voltage is normal, the condition of the charging system along with the idle voltage and the load voltage and the presence of excessive diode ripple.

In general, the present invention provides the integration of an alternator test with a battery test, an alternator test with a starter test, a starter test with an battery test, or an alternator test with a battery test and with a starter test. The invention allows information from any of these tests to be shared with the other test(s).

In one aspect, tester 10 measures the voltage across battery 20. Both the AC and DC voltages are recorded. The AC voltage is used to identify alternator diode and stator faults. The DC voltage measurement is used to determine if the charging system is functioning properly. The electrical loads of the vehicle are used to load the alternator for convenience. However, other types of loads can also be applied. The tester continually monitors the charging voltage across the battery. The operator is instructed to turn on vehicle loads and rev the engine. The charging voltage is recorded with the engine revved. In a properly functioning charging system, this charging voltage should be greater than the measured battery voltage with the engine off. This indicates that current is flowing into the battery and thus the battery is being charged even with loads applied to the charging system. This testing principle does not require knowledge of the alternator size, or even the amount of current that the alternator is producing. In the testing, various DC voltages across the battery are measured including battery voltage with the engine off (stead state voltage), battery voltage with the engine running at idle (idle voltage), battery voltage with the engine revved, for example between 1,000 RPM and 2,500 RPM, and the vehicle loads off and battery voltage with the engine revved and vehicle loads on. The AC voltage across the battery which is measured with the engine running is used to detect excessive ripple which may be caused by a faulty diode or stator. Ripple of over about 130 mV is indicative of a diode or stator problem. Additionally, the ripple can be used by tester 10 to detect changes in engine RPM.

An initial revving of the engine can be used prior to returning to idle to ensure that the alternator field circuit is excited and conducting current. If the idle voltage with the loads off is less than or equal to the steady state voltage, then a charging problem exists. If the charging voltage exceeds the steady state voltage by more than, for example, 0.5 volts, then a regulator problem is indicated.

With the engine revved and the vehicle loads (such as head lights, blower, rear defrost, etc.) turned on, the revved and loaded voltage across the battery is recorded and compared to the steady state battery voltage. If the charging voltage with loads turned on while the engine is revved is not greater than the steady state voltage, then current is not flowing into the battery and the battery is not being charge. This indicates a problem and that the alternator cannot meet the needs of the vehicle while still charging the battery.

With the present invention, the battery test can be used to prevent incorrectly identifying the charging system as being faulty. Thus, the battery test ensures that a good battery is being charged during the charging system test. The measurement of the cranking voltage while the engine is being started is used to determine whether there is a starter problem. In diesel engine applications, the charging system voltage is measured to determine if the engine glow plug operation is effecting the charging system test result. A long cabling (i.e., 10 to 15 feet) can be used such that the tester 10 can be operated while sitting in the vehicle. The battery testing is preferably performed by measuring the conductance, impedance, resistance or admittance of the battery. Further, the battery test with the engine off can be compared with the battery test with the engine on and used to diagnosis the system.

Another aspect of the present invention relates to the generation of an "audit code" based upon the results of a test. As used herein, the term audit code refers to an encrypted code which contains information about a test performed on an electrical system of a vehicle. Such information can be particularly useful in monitoring the operation and usage of test equipment. For example, if the present invention is used to test automobiles and warranty claims are then submitted to a manufacturer based upon the results of a test, the present invention can output an audit code after the completion of the test. A manufacturer can decrypt the audit code and reject a warranty claim if the audit code indicates the claim has been falsified. The audit code can contain information, in an encrypted format, which relates to the tests which were performed on a particular vehicle. For example, a manufacturer, such as a vehicle manufacturer, can audit the test(s) performed on a vehicle to reduce the occurrence of warranty fraud. Warranty fraud can occur when an unscrupulous operator attempts to falsify test results in order to return a properly functioning component or to receive payment for services which were not actually performed on a vehicle. Warranty fraud can cost a manufacturer a great deal of money and also lead to misdirected research and development efforts in an attempt to correct defects which do not actually exist.

In such an embodiment, any of the tests performed by the present invention or measurements obtained by the invention can be included in the audit code. More generally, the audit code of the present invention can be formed using the results of any starter motor test, alternator test, battery test or a AC ripple test. In a general embodiment of this aspect of the present invention, the particular testing technique used to obtain the test results may be any appropriate technique and is not limited to be specific techniques set forth herein.

Figure 9:
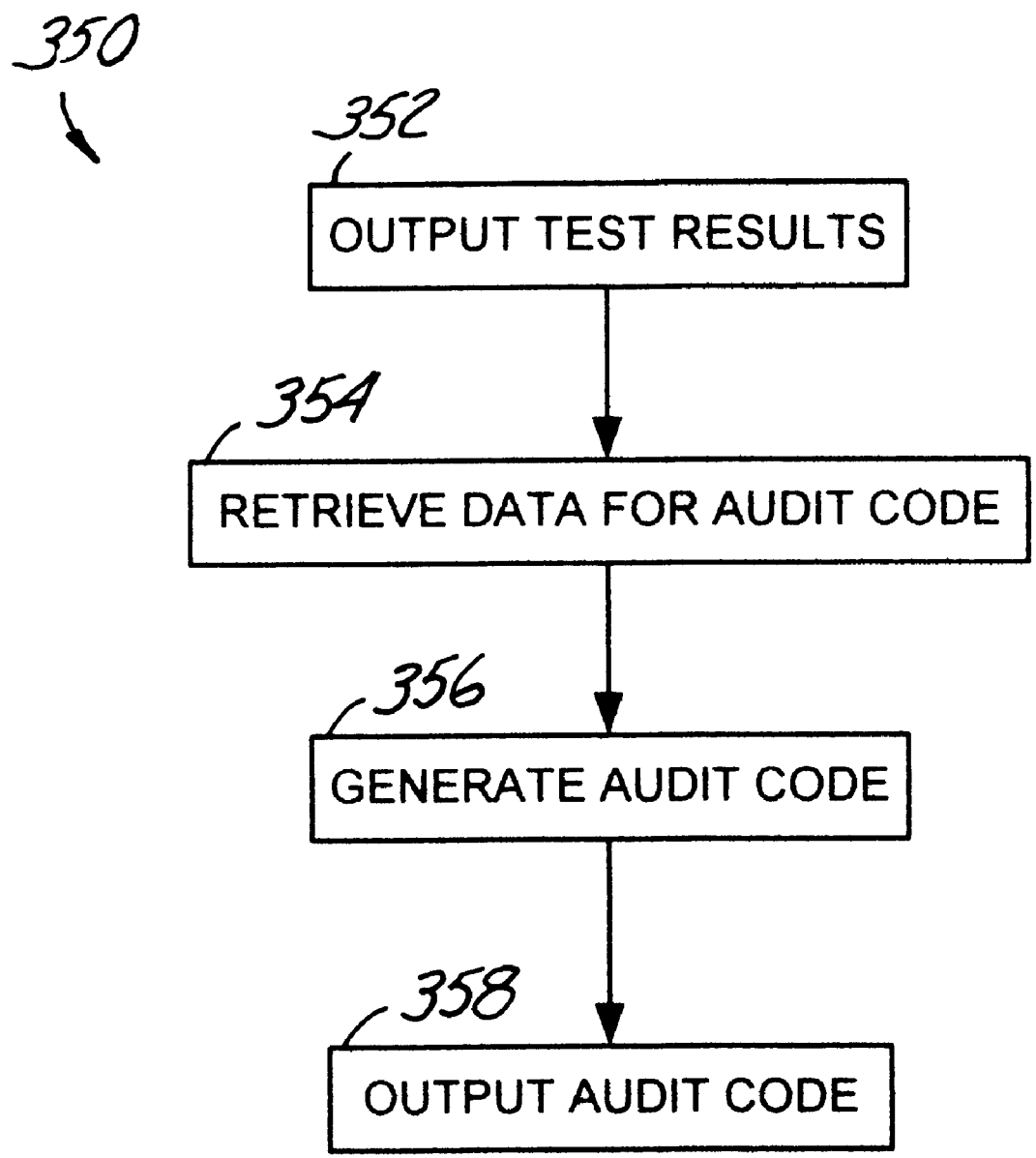
FIG. 9 is a simplified block diagram showing generation of an audit code in accordance with one aspect of the invention.

FIG. 9 is a simplified block diagram 350 showing steps in accordance with generation of an audit code of the present invention. The steps set forth in block diagram 350 are typically carried out by, for example, a microprocessor such as microprocessor 30 shown in FIG. 1. However, the steps may be implemented in hardware, software or their combination as appropriate.

Block 352 illustrates the general step of outputting test results. The test results can be, for example, the results of a starter test, alternator test, battery test or diode ripple test. At block 354, the microprocessor 30 retrieves the data which will be used in the audit code. As discussed herein, such data can comprise many different types of data including rating, operator or user identification, test data or results, etc. For example, this data can be retrieved from memory associated with the microprocessor. At block 356, microprocessor 30 generates an audit code based upon the retrieved data in accordance with any of the embodiments set forth herein. The audit code is generated using an encryption algorithm. The particular algorithm used can be selected in accordance with the desired level of security. However, for most systems, a transposition offset cipher can be used in which individual data elements are transposed and offset by known amounts. More complex algorithms such as RSA, rotating codes or public key based encryption algorithms can be used if desired. At block 358, the microprocessor 30 outputs the audit code, for example, on display 32. An operator can then copy the audit code onto a return form, or enter the audit code into a database system of the manufacturer. If the audit code will be handled directly by an operator, the code and encryption algorithm should be such that the output is alphanumeric or in a form which is otherwise easy to copy onto a warranty submission form. Of course, if the code is electronically submitted, for example through a data link, the code can take any form. Such data links include, for example, modem or hard wired links, infrared links, ultrasonic links, bar code outputs, RF outputs, or other techniques for conveying data which are known in the art.

The particular data which is used to form the audit code can be any of the final test results or intermediary measurements (that is, measurements which are used to obtain a final test result) set forth herein. For example, the measured starter voltage during cranking, the starter test result, the measured alternator voltage or voltages, the alternator test result, or the ripple test result can be encoded. Battery condition, state of charge or time to charge information can be encoded. Further, the date of the test can be maintained by microprocessor 30 and can be included in the audit code. Using this information, the test can be audited to determine if the measured alternator voltage or starter voltage could actually result in the encoded test results. Further, by checking the encoded date, it is possible to determine whether the vehicle was even in a repair shop during the test period. The raw data, such as voltage levels or other intermediary measurements, can be used by a manufacturer to collect data regarding the operation of a product. For example, a manufacturer could note that a particular change to an alternator resulted in a statistically significant drop in alternator voltages as measured in actual vehicles. This could be used in a research and development effort to improve system operation.

Other information which can be encoded into the audit code includes information regarding the make or model of the vehicle or battery, information such as the VIN identifying the vehicle, temperature information, time of day information, an identification which specifies the operator, the identity of the dealer or shop performing the test, data which identifies the test equipment or the software used in the test equipment, system or component ratings or other information entered by an operator, the number or sequence of the test, or other information.

Although the present invention has been described with reference to preferred embodiments, workers skilled in the art will recognize that changes may be made in form and detail without departing from the spirit and scope of the invention.

What is claimed is:

1. An automotive vehicle electrical system tester, comprising:
   a starter motor voltage measurement circuit configured to measure a starter voltage of a starter motor of a vehicle;
   a display;
   a microprocessor configured to determine a starter motor condition as a function of the starter voltage and responsively output the starter motor condition on the display, the microprocessor further configured to encrypt information and responsively output an encrypted output which includes information related to the starter voltage.

2. The automotive vehicle tester of claim 1 wherein the microprocessor is further configured to encrypt date information related to a date of a test and wherein the encrypted output includes date information.

3. The automotive vehicle tester of claim 1 wherein the microprocessor is further configured to encrypt time information related to a time of a test and wherein the encrypted output includes time information.

4. The automotive vehicle tester of claim 1 wherein the microprocessor is configured to measure a battery voltage of a battery of the electrical system and wherein the encrypted output includes information related to the battery voltage.

5. The automotive vehicle tester of claim 1 wherein the encrypted output includes information related to the starter motor condition.

6. The automotive vehicle tester of claim 1 wherein the microprocessor is further configured to measure an alternator voltage and wherein the encrypted output includes information related to the alternator voltage.

7. The automotive vehicle tester of claim 1 wherein the microprocessor is further configured to measure an alternator ripple voltage and wherein the encrypted output includes information related to an alternator ripple voltage.

8. The automotive vehicle tester of claim 1 wherein the microprocessor is further configured to perform an alternator test and wherein the encrypted output includes information related to a result of the alternator test.

9. The automotive vehicle tester of claim 1 wherein the microprocessor is further configured to perform a battery test and wherein the encrypted output includes information related to a result of the batter test.

10. The automotive vehicle tester of claim 1 wherein the microprocessor is further configured to encrypt a rating related to the automotive vehicle electrical system and wherein the output includes rating information.

11. The automotive vehicle tester of claim 1 wherein the microprocessor maintains a number of sequence of a test and the encrypted output includes number of sequence information.

12. The automotive vehicle tester of claim 1 wherein the microprocessor is further configured to encrypt information which identifies a vehicle under test and wherein the encrypted output includes vehicle identification information.

13. The automotive vehicle tester of claim 12 wherein the vehicle information comprises a VIN for the vehicle.

14. The automotive vehicle tester of claim 1 wherein the microprocessor is further configured to encrypt information related to an operator who performed the test.

15. The automotive vehicle tester of claim 1 wherein the microprocessor is further configured to encrypt information related to a dealer who performed the test and the encrypted output includes encrypted information which identifies the dealer.

16. The automotive vehicle tester of claim 1 wherein the microprocessor is further configured to obtain voltage measurements from the voltage measurement circuitry while an engine of the vehicle is running at different speeds and/or different loads are applied to the electrical system and responsively provide an alternator diagnostic output.

17. The automotive vehicle tester of claim 16 wherein the encrypted output includes information related to the alternator diagnostic output.

18. The automotive vehicle tester of claim 16 wherein the microprocessor further preforms a battery test and the starter motor condition is further a function of the battery test.

19. The automotive vehicle tester of claim 1 wherein the starting motor condition comprises a cranking voltage low indication.

20. The automotive vehicle tester of claim 1 wherein the starting motor condition comprises a cranking voltage normal indication.

21. The automotive vehicle tester of claim 1 wherein the starting motor condition comprises a replace battery indication.

22. The automotive vehicle tester of claim 1 wherein the microprocessor measures at least one of a battery voltage with an engine of the vehicle idling, a battery voltage with the engine revved, a battery voltage with the engine idling and a load applied to the battery, a battery voltage with this engine revved and a load applied to the battery and wherein the encrypted output includes at least one of the voltages responsively provides an output indicating a low charging voltage, no charging voltage, a normal charging voltage or a high charging voltage.

23. The automotive vehicle tester of claim 1 wherein the microprocessor is further configured to encrypt temperature information and wherein the encrypted output includes temperature information.

24. The automotive vehicle tester of claim 1 including a user input and wherein the microprocessor is further configured to encrypt the user input and the encrypted output includes user input information.

25. The automotive vehicle tester of claim 1 including a Kelvin connection configured to couple to the electrical system of the vehicle.

26. The automotive vehicle tester of claim 1 wherein the encrypted output comprises a visual display.

27. The automotive vehicle tester of claim 1 wherein the encrypted output comprises a data transmission.

28. The automotive vehicle tester of claim 27 wherein the data transmission comprises an infra red transmission.

29. The automotive vehicle tester of claim 27 wherein the data transmission comprises an RF transmission.

30. The automotive vehicle tester of claim 27 wherein the data transmission comprises a modem link.

31. The automotive vehicle tester of claim 1 wherein the encrypted output comprises an alpha numeric code.

32. The automotive vehicle tester of claim 1 wherein the encrypted output includes the alternator condition.

33. The method of claim 1 including obtaining voltage measurements while an engine of the vehicle is running at different speeds and/or different loads are applied to the electrical system and responsively provide an alternator diagnostic output.

34. An automotive vehicle electrical system tester, comprising:
   a alternator voltage measurement circuit configured to measure a voltage of a alternator of a vehicle;
   a display;
   a microprocessor configured to determine a alternator condition as a function of the alternator voltage and responsively output the alternator condition on the display, the microprocessor further configured to encrypt information provide an encrypted output which is related to the alternator voltage output alternator.

35. The automotive vehicle tester of claim 34 wherein the microprocessor is configured to measure a battery voltage of a battery of the electrical system and wherein the encrypted output includes information related to the battery voltage.

36. The automotive vehicle tester of claim 32 wherein the microprocessor is further configured to measure a starter voltage and wherein the encrypted output includes information related to the starter voltage.

37. The automotive vehicle tester of claim 32 wherein the microprocessor is further configured to measure an alternator ripple voltage and wherein the encrypted output includes information related to the alternator ripple voltage.

38. The automotive vehicle tester of claim 32 wherein the microprocessor is further configured to perform a battery test and wherein the encrypted output includes an information related to a result of the batter test.

39. The automotive vehicle tester of claim 32 wherein the microprocessor is further configured to encrypt a rating related to the automotive vehicle electrical system and wherein the output includes rating information.

40. The automotive vehicle tester of claim 32 wherein the microprocessor maintains a number of sequence of a test and the encrypted output includes number of sequence information.

41. The automotive vehicle tester of claim 32 wherein the microprocessor is further configured to encrypt information which identifies a vehicle under test and wherein the encrypted output includes vehicle identification information.

42. The automotive vehicle tester of claim 41 wherein the vehicle information comprises a VIN for the vehicle.

43. The automotive vehicle tester of claim 1 wherein the microprocessor is further configured to encrypt information related to who performed the test.

44. The automotive vehicle tester of claim 43 wherein the information related to who performed the test comprises information which identifies a dealer or shop.

45. The automotive vehicle tester of claim 1 wherein the microprocessor is further configured to obtain voltage measurements from the voltage measurement circuitry while an engine of the vehicle is running at different speeds and/or different loads are applied to the electrical system and responsively provide the alternator condition output.

46. The automotive vehicle tester of claim 32 wherein microprocessor is configured to encrypt the alternator condition output.

47. The automotive vehicle tester of claim 32 wherein the microprocessor further preforms a battery test and the alternator condition is further a function of the battery test.

48. The automotive vehicle tester of claim 32 wherein the microprocessor is configured to measure a starting voltage while the starting motor is actuated.

49. The automotive vehicle tester of claim 32 wherein the microprocessor measures at least one of a battery voltage with an engine of the vehicle idling, a battery voltage with the engine revved, a battery voltage with the engine idling and a load applied to the battery, a battery voltage with this engine revved and a load applied to the battery and wherein the encrypted output includes at least one of the voltages responsively provides an output indicating a low charging voltage, no charging voltage, a normal charging voltage or a high charging voltage.

50. The automotive vehicle tester of claim 32 wherein the microprocessor is further configured to encrypt temperature information and wherein the encrypted output includes temperature information.

51. The automotive vehicle tester of claim 32 including a user input and wherein the microprocessor is further configured to encrypt the user input and the encrypted output includes user input information.

52. The automotive vehicle tester of claim 32 including a Kelvin connection configured to couple to the electrical system of the vehicle.

53. The automotive vehicle tester of claim 32 wherein the encrypted output comprises a visual display.

54. The automotive vehicle tester of claim 32 wherein the encrypted output comprises a data transmission.

55. The automotive vehicle tester of claim 54 wherein the data transmission comprises an infra red transmission.

56. The automotive vehicle tester of claim 54 wherein the data transmission comprises an RF transmission.

57. The automotive vehicle tester of claim 54 wherein the data transmission comprises a modem link.

58. The automotive vehicle tester of claim 32 wherein the encrypted output comprises an alpha numeric code.

59. The automotive vehicle tester of claim 34 wherein the microprocessor is further configured to encrypt date information related to a date of a test and wherein the encrypted output includes date information.

60. The automotive vehicle tester of claim 34 wherein the microprocessor is further configured to encrypt time information related to a time of a test and wherein the encrypted output includes time information.

61. A method of testing an automotive vehicle electrical system, comprising:
   measuring a starter motor voltage related to a voltage during operation of a starter motor of a vehicle;
   determining a starter motor condition as a function of the starter motor voltage;
   displaying the starter motor condition;
   encrypting data related to the starter motor voltage; and
   outputting the encrypted data.

62. The method of claim 61 wherein the encrypted data includes encrypted date information.

63. The method of claim 61 wherein the encrypted data includes encrypted time information.

64. The method of claim 61 including measuring a battery voltage of a battery of the electrical system and wherein the encrypted data includes information related to battery voltage.

65. The method of claim 61 including measuring a starter motor voltage and wherein the encrypted data includes information related to condition starter motor.

66. The method of claim 61 including measuring an alternator voltage and wherein the encrypted data includes information related to alternator voltage.

67. The method of claim 61 including measuring an alternator ripple voltage and wherein the encrypted data includes information related to alternator ripple voltage.

68. The method of claim 61 including determining a result of an alternator test and wherein the encrypted data includes information related to the result of the alternator test.

69. The method of claim 60 including performing a battery test and wherein the encrypted data includes information related to a result of the batter test.

70. The method of claim 60 including encrypting a rating related to the automotive vehicle electrical system and wherein the encrypted data includes rating information.

71. The method of claim 60 including maintaining a number of sequence of a test and the encrypted data includes number of sequence information.

72. The method of claim 60 including receiving information which identifies a vehicle under test and wherein the encrypted data includes vehicle identification information.

73. The method of claim 72 wherein the vehicle information comprises a VIN for the vehicle.

74. The method of claim 60 including encrypting information related to who performed the test.

75. The method of claim 74 wherein the information related to who performed the test comprises information which identifies a dealer or shop.

76. The method of claim 60 including obtaining voltage measurements while an engine of the vehicle is running at different speeds and/or different loads are applied to the electrical system and responsively providing an alternator diagnostic output.

77. The method of claim 76 including encrypting the alternator condition.

78. The method of claim 60 including preforming a battery test and the alternator condition output is further a function of the battery test.

79. The method of claim 60 including measuring a starting voltage while a starting motor is actuated.

80. The method of claim 60 including measuring at least one of a battery voltage with an engine of the vehicle idling, a battery voltage with the engine revved, a battery voltage with the engine idling and a load applied to the battery, a battery voltage with this engine revved and a load applied to the battery and wherein the encrypted output includes at least one of the voltages responsively provides an output indicating a low charging voltage, no charging voltage, a normal charging voltage or a high charging voltage.

81. The method of claim 60 including encrypting temperature information and wherein the encrypted data includes temperature information.

82. The method of claim 60 including encrypting a user input and the encrypted data includes user input information.

83. The method of claim 60 including providing a Kelvin connection to couple to the electrical system of the vehicle.

84. The method of claim 60 wherein outputting encrypted data comprises providing a visual display.

85. The method of claim 60 wherein outputting the encrypted data comprises providing a data transmission.

86. The method of claim 85 wherein the data transmission comprises an infra red transmission.

87. The method of claim 85 wherein the data transmission comprises an RF transmission.

88. The method of claim 85 wherein the data transmission comprises a modem link.

89. The method of claim 85 wherein the encrypted output comprises an alpha numeric code.

90. The method of claim 61 wherein the encrypted data includes the starter motor condition.

91. A method of testing an automotive vehicle electrical system, comprising:

measuring an alternator voltage related to operation of an alternator of a vehicle;

determining an alternator condition as a function of the alternator voltage;

displaying the alternator condition;

encrypting data related to the alternator voltage; and outputting the encrypted data.

92. The method of claim 91 wherein the encrypted output includes time information.

93. The method of claim 90 including measuring a battery voltage of a battery of the electrical system and wherein the encrypted includes battery voltage information.

94. The method of claim 90 including measuring a starter voltage and wherein the encrypted data includes information related to the starter voltage.

95. The method of claim 90 wherein the encrypted data includes the alternator condition.

96. The method of claim 90 including measuring an alternator ripple voltage and wherein the encrypted data includes information related to alternator ripple voltage.

97. The method of claim 90 including performing a battery test and wherein the encrypted data includes information related to a result of the batter test.

98. The method of claim 90 including encrypting a rating related to the automotive vehicle electrical system and wherein the encrypted data includes rating information.

99. The method of claim 90 including maintaining a number of sequence of a test and wherein the encrypted data includes number of sequence information.

100. The method of claim 90 including encrypting information which identifies a vehicle under test and wherein the encrypted data includes vehicle identification information.

101. The method of claim 100 wherein the vehicle information comprises a VIN for the vehicle.

102. The method of claim 90 wherein the encrypted output includes information related to who performed the test.

103. The method of claim 102 wherein the information related to who performed the test comprises information which identifies a dealer or shop.

104. The method of claim 91 wherein the encrypted output includes date information.

105. The method of claim 90 including performing a battery test and wherein the alternator condition is further a function of the battery test.

106. The method of claim 90 including measuring a starting voltage while the starting motor is actuated.

107. The method of claim 90 including measuring at least one of a battery voltage with an engine of the vehicle idling, a battery voltage with the engine revved, a battery voltage with the engine idling and a load applied to the battery, a battery voltage with this engine revved and a load applied to the battery and wherein the encrypted output includes at least one of the voltages responsively provides an output indicating a low charging voltage, no charging voltage, a normal charging voltage or a high charging voltage.

108. The method of claim 90 including encrypting temperature information and wherein the encrypted data includes temperature information.

109. The method of claim 90 including receiving a user input and encrypting the user input and wherein the encrypted data includes user input information.

110. The method of claim 90 including providing Kelvin connections to couple to the electrical system of the vehicle.

111. The method of claim 90 wherein outputting comprises providing a visual display.

112. The method of claim 90 wherein outputting comprises providing a data transmission.

113. The method of claim 112 wherein the data transmission comprises an infra red transmission.

114. The method of claim 112 wherein the data transmission comprises an RF transmission.

115. The method of claim 112 wherein the data transmission comprises a modem link.

116. The method of claim 90 wherein the encrypted data comprises an alpha numeric code.

117. The method of claim 90 wherein the encrypted data includes state of charge information related to a battery of the vehicle.

118. The method of claim 90 wherein the encrypted information relates to a time to charge a battery of the vehicle.

* * * * *

UNITED STATES PATENT AND TRADEMARK OFFICE
CERTIFICATE OF CORRECTION

PATENT NO. : 6,445,158 B1
DATED : September 3, 2002
INVENTOR(S) : Kevin I. Bertness et al.

It is certified that error appears in the above-identified patent and that said Letters Patent is hereby corrected as shown below:

Column 9,
Line 59, change "batter" to -- battery --.

Column 10,
Lines 27, 30 and 33, change "starting" to -- starter --.

Column 11,
Lines 22, 26, 30, 34, 38, 41, 59, 62 and 65, change "claim 32" to -- claim 34 --.
Line 33, change "batter" to -- battery --.
Lines 47 and 53, change "claim 1" to -- claim 34 --.
Line 67, change "starting" to -- starter --.

Column 12,
Lines 1, 11, 14, 19, 22, 24 and 32, change "claim 32" to -- claim 34 --.
Line 61, after "condition" insert -- of the --.

Column 13,
Lines 4, 7, 10, 13, 18, 24, 31, 34, 36, 45, 48, 50, 52 and 54, change "claim 60" to
-- claim 61 --.
Line 6, change "batter" to -- battery --.

Column 14,
Lines 11, 14, 17, 19, 23, 26, 32, 37, 46, 49, 51, 60, 63 and 66, change "claim 90" to
-- claim 91 --.
Line 13, after "encrypted" insert -- data --.
Line 25, change "batter" to -- battery --.
Line 50, change "starting" to -- starter --.

Column 15,
Lines 1 and 3, change "claim 90" to -- claim 91 --.

UNITED STATES PATENT AND TRADEMARK OFFICE
CERTIFICATE OF CORRECTION

PATENT NO. : 6,445,158 B1
DATED : September 3, 2002
INVENTOR(S) : Kevin I. Bertness et al.

It is certified that error appears in the above-identified patent and that said Letters Patent is hereby corrected as shown below:

Column 16,
Lines 1, 3 and 6, change "claim 90" to -- claim 91 --.

Signed and Sealed this

Twenty-eighth Day of October, 2003

JAMES E. ROGAN
*Director of the United States Patent and Trademark Office*